United States Patent [19]

Potter

[11] Patent Number: 5,235,534

[45] Date of Patent: Aug. 10, 1993

[54] METHOD AND APPARATUS FOR INTERPOLATING BETWEEN DATA SAMPLES

[75] Inventor: Ronald W. Potter, Snohomish, Wash.

[73] Assignee: Hewlett-Packard Company, Palo Alto, Calif.

[21] Appl. No.: 722,377

[22] Filed: Aug. 25, 1991

Related U.S. Application Data

[63] Continuation of Ser. No. 565,853, Aug. 9, 1990, abandoned, which is a continuation of Ser. No. 234,460, Aug. 18, 1988, abandoned.

[51] Int. Cl.$^5$ .............................................. G06F 15/31
[52] U.S. Cl. ................................... 364/724.01; 364/577
[58] Field of Search ................ 364/724.01, 577, 487, 364/485, 179, 178

[56] References Cited

U.S. PATENT DOCUMENTS

| | | | |
|---|---|---|---|
| 3,715,715 | 2/1973 | Ruehle | 364/485 |
| 4,020,332 | 4/1977 | Crochiere et al. | 364/724.1 |
| 4,455,613 | 6/1984 | Shoemaker | 364/487 |
| 4,542,336 | 9/1985 | Powell | 364/485 |
| 4,604,720 | 8/1986 | Stikvoort | 364/724.1 |
| 4,654,634 | 3/1987 | Thong et al. | 364/178 |
| 4,689,759 | 8/1987 | Anouar et al. | 364/577 X |
| 4,716,472 | 12/1987 | McNally | 364/724.1 |
| 4,782,324 | 11/1988 | Underwood | 364/724.1 X |
| 4,789,950 | 12/1988 | Saxe et al. | 364/577 |
| 4,825,398 | 4/1989 | Koch et al. | 364/724.1 |
| 4,866,647 | 9/1989 | Farrow | 364/724.1 |

OTHER PUBLICATIONS

"Optimum FIR Digital Filter Implementations for Decimation, Interpolation, and Narrow–Band Filtering" by Crochiere and Rabiner IEEE Trans. on Acoustics, Speech and Signal Processing vol. ASSP-23, No. 5, Oct. 1975, pp. 444–456.

(List continued on next page.)

Primary Examiner—Jack B. Harvey
Assistant Examiner—Ellis B. Ramirez

[57] ABSTRACT

A method and apparatus for interpolating between data samples ($V_S$) that preserves the frequency spectrum of a sampled analog signal ($V_O$) is provided. Data samples ($V_S$) are interpolated to produce interpolated values ($V_{IV}$) that contain frequency domain information that accurately replicates an original frequency spectrum (24) of the analog signal ($V_O$) is disclosed. A signal processor (10) reads data samples ($V_S$) which occur at sampling times ($t_S$) and resample times ($t_R$) at which the $V_S$ values are interpolated. A set of $t_S$ times are found near each $t_R$ time. A digital FIR filter having a frequency function (H(fT)) and a continuous impulse response function $$h\left(\frac{t}{T}\right)$$

is embodied in software form within a program that controls the signal processor (10) where T is the width of the filter impulse response. The signal processor (10) convolves an offset continuous impulse response function $$\left(h\left(\frac{t'-K\Delta t}{T}\right)\right)$$

with the $V_S$ values. A plurality of convolved values ($V_C$) are summed at each $t_R$ time to produce an interpolated value ($V_{IV}$) at each $t_R$ time. The frequency response function (H(fT)) of the digital FIR filter reduces aliasing errors introduced by spectral images (25a and 25b) of the original frequency spectrum (24) and reduces amplitude errors caused by the filter's pass band ripple (38). The $V_{IV}$ values contain frequency domain information that accurately replicates the original frequency spectrum (24).

15 Claims, 8 Drawing Sheets

OTHER PUBLICATIONS

"Nine Digital Filters for Decimation and Interpolation" by David J. Goodman IEEE vol. ASSP-25 No. 2 Apr. 1977 pp. 121–126.

McFadden, "Interpolation Techniques for the Time Domain Averaging of Vibration Data with Application to Helicopter Gearbox Monitoring", Australia Aeronautical Research Laboratories, Aero Propulsion Technical Memorandum 437, Sep., 1986.

Pope, "Basic Studies of Automobile Tire Noise", Ph.D. Dissertation, Stanford University, May, 1978.

Hildebrand, "Introduction to Numerical Analysis," Chapter 3 (2d ed. 1973), pp. 81–115.

Schafer and Rabiner, "A Digital Processing Approach to Interpolation," Proceedings of the IEEE, vol. 61, No. 6, Jun., 1973, pp. 692–702.

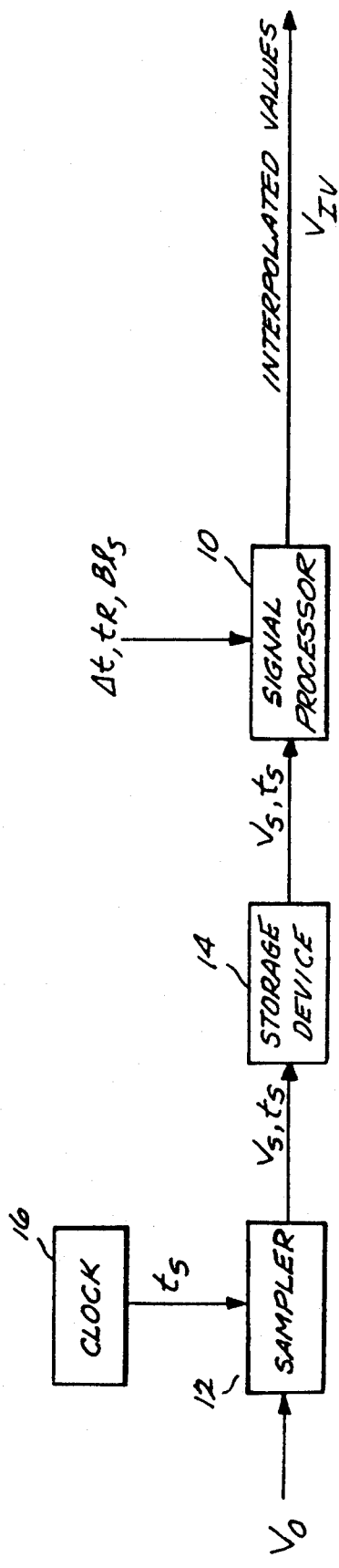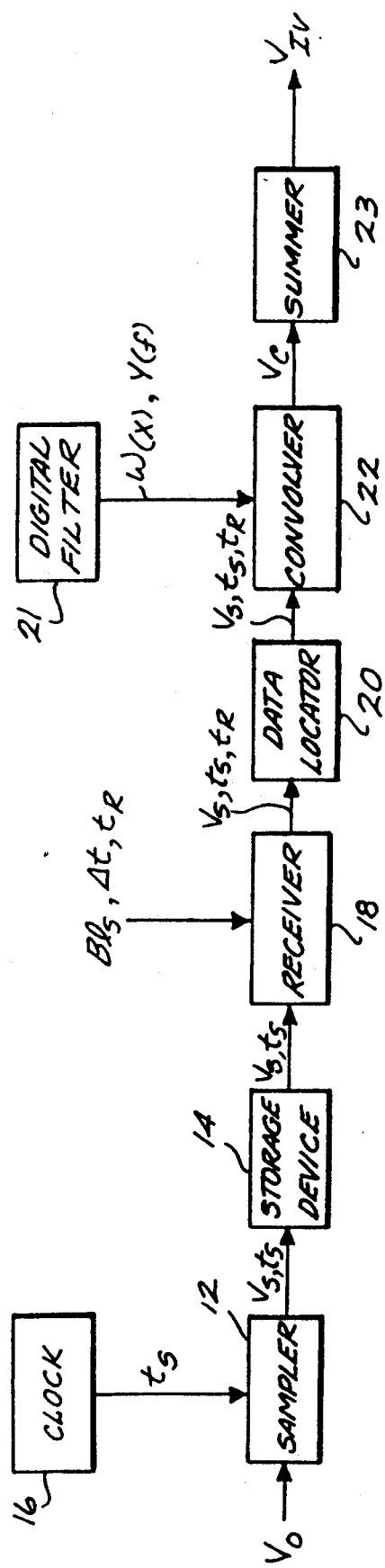

METHOD AND APPARATUS FOR INTERPOLATING BETWEEN DATA SAMPLES

CROSS REFERENCE TO RELATED APPLICATION

This is a continuation of copending application Ser. No. 07/565,853 filed on Aug. 9, 1990, now abandoned, which is a continuation of application Ser. No. 07/234,460, filed Aug. 18, 1988, now abandoned.

TECHNICAL FIELD

The invention relates generally to preserving the frequency information of a sampled analog signal and, more particularly, to a method and apparatus for interpolating between data samples such that the interpolated values contain the same frequency domain information contained in the sampled analog signal.

BACKGROUND OF THE INVENTION

Analog signals contain frequency domain information and time domain information that may be of interest to persons analyzing the signals. For various reasons, analog signals are often sampled by a time-based sampling process prior to analyzing the signal. Data samples produced by the sampling process contain both time domain information and frequency domain information about the analog signal. The time domain information, such as amplitude, for example, can be analyzed by measuring the amplitude of the data samples with an appropriate measuring device, such as a voltmeter, for example. Likewise, the frequency domain information can be analyzed by an appropriate apparatus, such as a digital spectrum analyzer, for example.

In order to find time and frequency domain information for points between data samples, an interpolation technique must be used. The prior art offers numerous time-based methods of interpolation that provide varying degrees of accuracy between the interpolated values and the analog signal. Like the original data samples, time domain information contained in an interpolated value, such as amplitude, can then be measured by an appropriate device, such as a voltmeter.

Likewise, if frequency domain information is sought for points between data samples, the data samples must be interpolated to find these values. Unfortunately, a time-based sampling process that produces data samples of an analog signal also produces spectral images of the analog signal's frequency spectrum. As a result, the data samples contain frequency domain information that includes the analog signal frequency spectrum information plus image information. The image information corrupts the frequency spectrum information so that the frequency domain information contained in the data samples does not accurately replicate the frequency spectrum of the analog signal. Prior art interpolation techniques further corrupt the frequency information contained in the data samples. As a result, the frequency information contained in the interpolated values does not accurately represent the frequency information contained in the analog signal.

As can be appreciated from the foregoing discussion, there is a need to provide a method and apparatus for interpolating between data samples such that the interpolated values contain the same frequency information contained in the sampled analog signal, i.e., such that the frequency spectrum of the sampled analog signal is preserved. The present invention is directed to a method and apparatus for interpolating between data samples using a digital filter in a novel manner that achieves this result, i.e., produces interpolated values that preserve the frequency spectrum of an analog signal.

SUMMARY OF THE INVENTION

In accordance with this invention, a method and apparatus for producing interpolated values that contain accurate information about the original frequency spectrum of a sampled analog signal is provided.

The Sampling Theorem states the property that a band-limited signal can be uniquely represented by a set of samples taken at time intervals spaces $\frac{1}{2}W$ seconds apart where W is the signal bandwidth in hertz. See for example, *Continuous and Discrete Signal and System Analysis*. Clare D. McGillem; George R. Cooper; Holt, Rinehart and Winston Inc., 1974, pp. 167–170. By the term "uniquely represented" is meant that the original signal can be exactly recovered from the samples.

The process of sampling (in the time domain) entails the multiplication of the band-limited signal by a train of delta functions. This multiplication in the time domain is equivalent to a convolution in the frequency domain. The convolving of the band-limited signal with the delta function in the frequency domain results in images of the of the original frequency spectrum of the band-limited signal at multiples of the sampling frequency. In order to accurately recover the original band-limited signal, these images must be removed. Similarly, in order to generate interpolated values which accurately reflect the original frequency spectrum of the band-limited signal, during the interpolation process the images of the original frequency spectrum must be removed.

The method of the present invention allows the calculation of interpolated values which accurately reflect the frequency spectrum contained by the original analog signal. The method comprises the steps of: receiving data samples of an analog signal that contain frequency domain information about the analog signal original frequency spectrum and images of the analog signal original frequency spectrum; and, interpolating between the data samples to produce interpolated values that contain frequency domain information that can be used to accurately replicate the frequency spectrum of the analog signal.

In accordance with further aspects of this invention, the step of interpolating comprises the substeps of: receiving resample times and sampled data; weighting the continuous impulse response of a finite impulse response filter to produce a plurality of convolution values at each resample time; and, summing the convolution values to produce the interpolated values. The impulse response is weighted to produce a convolution value at a resample time by centering the impulse response on a sample time and multiplying the data sample value at the same time by the value of the impulse response at the resample time.

In accordance with further aspects of the invention, the apparatus comprises: a receiver; a data locator; a filter; a convolver; and, a summer. The receiver receives the data samples and the resample times. The data locator finds a set of data samples located near each resample time. The convolver weights with the data samples in each set the continuous impulse response of the filter to produce a plurality of convolution values at each of the resample times. The summer sums the plurality of convolution values at each resample time to produce an interpolated value at each of the resample times.

In accordance with further aspects of this invention, the filter passes information about the analog signal frequency spectrum and filters out most of the information about the images of the analog signal frequency spectrum.

As will be appreciated from the foregoing summary, the present invention provides a method and apparatus for preserving the frequency spectrum of a sampled analog signal by interpolating data samples using a digital filter such that the interpolated values contain frequency domain information that can be used to accurately replicate the frequency spectrum of the analog signal.

The present invention allows for the production of interpolated values which contain accurate information about the frequency spectrum of an analog signal which has been band-limited and then sampled. The purposes of the present invention are accomplished by the convolution of data samples with a finite impulse response filter in order to produce the interpolated values. As is further described in the Description of the Preferred Embodiment, the design of the filter is critical in order to assure that the interpolated values will contain accurate information about the frequency spectrum. When designing the filter it is necessary to specify the range and accuracy of the filter's passband frequency and the actual level of attenuation of the filter's stopband so that the frequency spectrum will be accurately preserved. Further, before being sampled the original analog signal is band-limited. The present invention also has the advantage of allowing for interpolated values to be calculated at arbitrary resample times.

BRIEF DESCRIPTION OF THE DRAWINGS

The foregoing, and other features and advantages of this invention, will become more readily appreciated as the same becomes further understood by reference to the following detailed description when taken in conjunction with the accompanying drawings, wherein:

FIG. 1 is a simplified block diagram of a preferred embodiment of an interpolating apparatus formed in accordance with the invention;

FIG. 3 is a simplified block diagram depicting an alternative embodiment of the apparatus illustrated in FIG. 1.

DESCRIPTION OF THE PREFERRED EMBODIMENT

Figure 2:
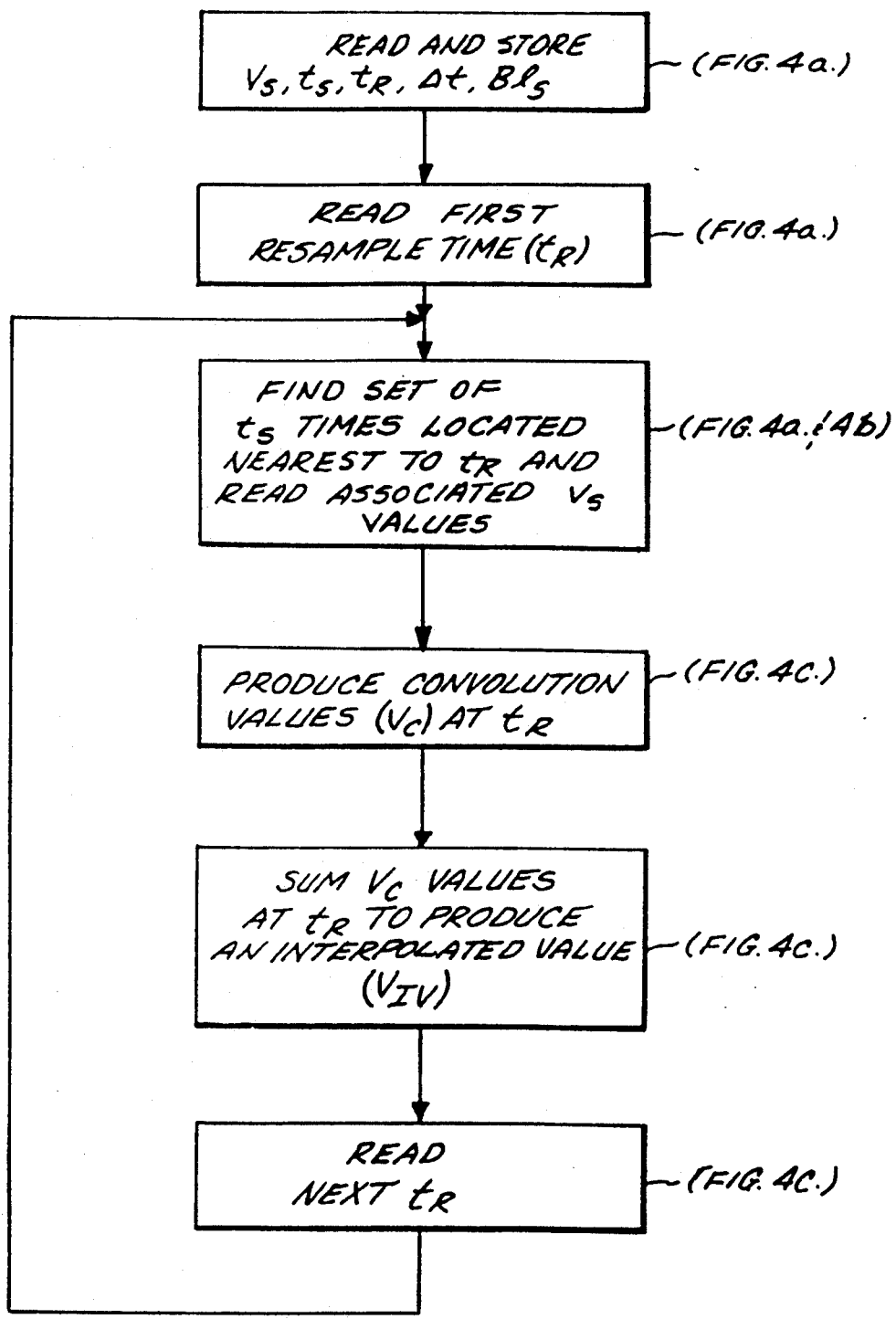
FIG. 2 is a simplified flowchart illustrating the functional steps of a program for controlling the apparatus illustrated in FIG. 1.

There are situations where it is desirable to analyze, in the frequency domain, data that has been created in the time domain. Such a situation arises when an original analog signal is sampled by a time-based sampling process that produces data samples. While there are numerous interpolation techniques that will provide interpolated values in the time domain based on the data samples, in general, such techniques ignore the frequency domain information contained in the data samples. As a result, the interpolated values may not contain accurate frequency domain information. As a consequence, there has developed a need for an interpolating technique that will produce interpolated values containing accurate frequency domain information. Among other benefits, such values can be used to analyze the frequency spectrum of the original analog signal. Another example of frequency domain information that is of interest to some industries is the changes in phase angle of the shaft of a rotating machine that occur as the machine is operated. The frequency spectrum of analog signals created when such a machine is operated contains shaft phase angle information. As will become obvious from the following discussion, the present invention provides a method and apparatus for preserving the frequency spectrum of an analog signal by interpolating data samples using a digital filter in a novel manner so as to overcome the foregoing problems of the prior art.

FIG. 1 illustrates a preferred embodiment of an apparatus for interpolating data samples in accordance with the present invention. The apparatus illustrated in FIG. 1 comprises: a signal processor 10; a sampler 12; a storage device 14; and a clock 16. The sampler 12, the storage device 14 and the clock 16, per se, do not form part of the present invention. They are included so that the invention will be more easily understood. An original fluctuating analog signal, designated $V_O$, which has an original frequency spectrum, is applied to the sampler 12. The sampler 12 sampler 12 samples the $V_O$ signal and produces a digital data signal comprising data samples, designated $V_S$, taken at known sample times, designated $t_S$. The $t_S$ times are provided to the sampler 12 by the clock 16. The $V_S$ values and the $t_S$ times are stored in the storage device 14.

As will be better understood from the following discussion, the signal processor 10 receives control information from an external source, such as time intervals between the $t_S$ times, designated $\Delta t$; resample times at which interpolation is to be performed, designated $t_R$; and, the number of $t_R$ times required, i.e., a data block size, designated Bis. As required, the signal processor 10 also receives the $V_S$ and $t_S$ values stored in the storage device 14. Based upon the externally generated control information and the $V_S$ and $t_S$ values, the signal processor 10 produces a series of interpolated values, designated $V_{IV}$. The $V_{IV}$ values contain frequency domain information as well as time domain information. As will be better understood from the following discussion, the $V_{IV}$ values can be used to accurately replicate both the time and frequency domain information contained in the $V_O$ signal. The signal processor 10 can take the form of a specialized signal processor, i.e., a signal processor containing a program dedicated to carrying out the invention, or a suitably programmed general purpose computer.

The broad functional steps of the program that controls the signal processor 10 are illustrated in FIG. 2 and discussed next. Initially, the signal processor 10 reads into its internal memory the $V_S$ values, $t_S$ times, $t_R$ times, $\Delta t$ intervals, and the data block size, Bls. Next, the program causes the signal processor 10 to read the first $t_R$ time and find a set of $V_S$ values occurring at $t_S$ times that are located near the first $t_R$ time. As will be better understood from the discussion below, the size of the set of $V_S$ values is determined by the nature of a digital filter, specifically a digital finite impulse response (FIR) filter that, preferably, is implemented in software form in the signal processor 10. The digital FIR filter has a time domain or continuous impulse response function, designated h(x), where x is a normalized time (i.e., x=t/T, where T is defined below and t is some time of interest, such as $t_R$, for example) and a frequency domain or frequency response function, designated H(y), where y is a normalized frequency (i.e., y=fT). The continuous impulse response function, h(x), has a finite width, T. The size of the set of $V_S$ values is determined by the impulse response width, T. For example, if the impulse response width, T, encompasses four $t_S$ times, the signal processor 10 will find the four $V_S$ values associated with the four $t_S$ times nearest the first resample time, $t_R$. In this case, the digital FIR filter is commonly referred to as a four-point filter.

After the set of $V_S$ values has been found, the program instructs the signal processor to convolve the continuous impulse response function, h(x), of the digital FIR filter with each of the $V_S$ values in the set, to produce a convolved value, designated $V_C$, located at $t_R$, for each of the $V_S$ values in the set. As will become better understood from the following discussion, during this convolution step, the frequency response function, H(y), of the digital FIR filter performs a filtering operation. That is, the filter reduces the effects of spectral images introduced by the sampling process. Next, the signal processor 10 sums the $V_C$ values to produce a first interpolated value, $V_{IV}$, i.e., the $V_{IV}$ value associated with the first $t_R$ time. Once this $V_{IV}$ value has been computed, the program instructs the signal processor 10 to read the next $t_R$ time, and the functional steps discussed above are repeated. The functional steps illustrated in FIG. 2 are repeated until the signal processor 10 has produced $V_{IV}$ values for each of the $t_R$ times received and read by the signal processor 10. As a result of the filtering operation discussed above and other aspects of the filtering operation which are discussed below, the $V_{IV}$ values contain accurate frequency spectrum information of the original signal (i.e., $V_O$).

While the presently preferred embodiment of the invention comprises a signal processor 10 and a program for carrying out the invention, as discussed above and illustrated in FIGS. 1 and 2, it is to be understood that alternative embodiments exist which are also suitable for carrying out the invention. One such alternative embodiment is a hardware embodiment of the sort illustrated in FIG. 3. In this alternative hardware embodiment, the sampler 12, the storage device 14 and the clock 16 perform the functions discussed above. The alternative apparatus comprises: a receiver 18; a data locator 20; a digital filter 21; a convolver 22; and, a summer 23. The digital filter 21 is preferably a digital FIR filter having the h(x) and H(y) functions noted above.

The receiver 18 receives the $V_S$ values and $t_S$ times from the storage device 14. The data block size, Bls, the time interval between $t_S$ times, $\Delta t$, and the resample times, $t_R$, are provided to the receiver 18 by an external source. The data locator 20 finds the set of $t_S$ times nearest the first $t_R$ time and determines the associated $V_S$ values. As noted above, the size of the $V_S$ value set is determined by the impulse response width, T, of the impulse response function, h(x), of the digital FIR filter 21. Once the $V_S$ values have been found, the convolver 22 convolves the continuous impulse response function, h(x), with the $V_S$ values to produce a $V_C$ value located at the $t_R$ time for each $t_S$ time in the set. Next, the summer 23 sums the $V_C$ values at the $t_R$ time to produce the $V_{IV}$ value associated with the first $t_R$ time. The apparatus illustrated in FIG. 3 repeats the above process until $V_{IV}$ values have been produced for each $t_R$ time received by the receiver 18. In a manner similar to that discussed above for the signal processor 10 (FIG. 1), the frequency response function, H(y), of the digital FIR filter 21 performs a filtering operation. As a result, the original frequency spectrum of the $V_O$ signal is accurately reproduced in the frequency domain information contained in the $V_{IV}$ values.

Before returning to the preferred embodiment of the invention (FIG. 1) and discussing, in more detail, the functional steps of the program illustrated in FIG. 2, a general "background" discussion of various aspects of the present invention is presented so that the invention may be more easily understood. More specifically, the novel concepts of: using the continuous impulse response function, h(x), of a digital FIR filter to perform time-based interpolation of the data samples, $V_S$; and, using the frequency response function, H(y), of the digital FIR filter to produce $V_{IV}$ values that contain accurate frequency spectrum information of the original signal (i.e., $V_O$).

As is well known in the signal sampling art, digitally sampling an analog signal produces spectral images of the analog signal's frequency spectrum. As a result, the data samples produced by a digital sampling process contain frequency domain information relative to both the frequency spectrum of the analog signal and images of the frequency spectrum. When the data samples containing such information are interpolated, a portion of the image information is contributed to the analog signal frequency spectrum information contained in the interpolated values. This contribution of image information results in aliasing errors that distort the frequency spectrum information contained in the interpolated values. As a result, the frequency spectrum information contained in the interpolated values cannot be used to accurately determine the frequency spectrum of the analog signal. As will become better understood from the following discussion, the digital FIR filter used in the present invention reduces the contribution of the spectral image information in the interpolated values. As a result of this and other filtering operations performed by the filter, which are discussed below, the frequency domain information contained in the interpolated values can be used to accurately determine the frequency spectrum of the analog signal.

A key to the present invention is the attenuating of images of a frequency spectrum of a sampled analog signal by convolving data samples with an impulse response of a filter. The following discussion shows how the impulse response of the filter may be selected to allow for the attenuation of the images of the analog signal original frequency spectrum.

Figure 5:
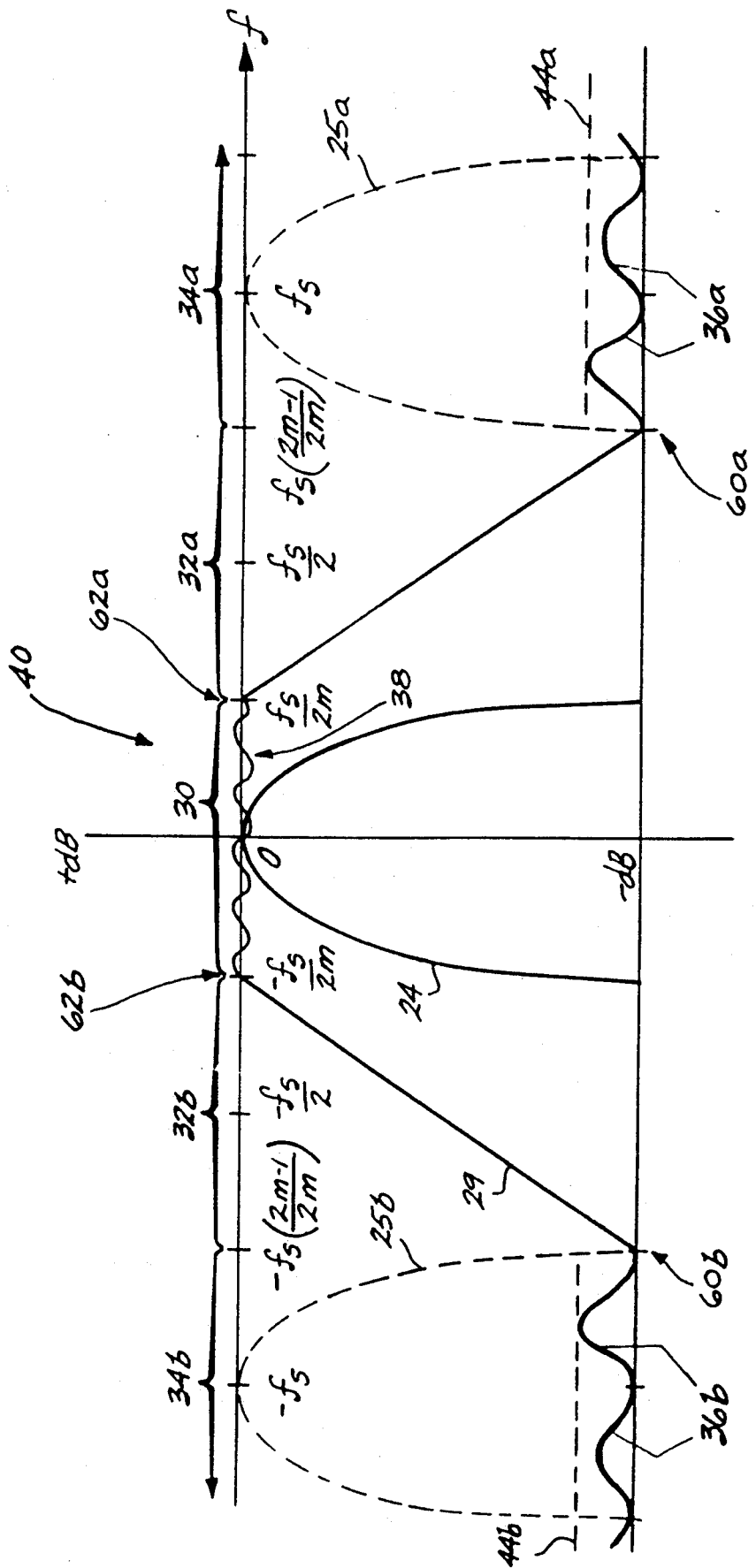
FIG. 5 illustrates the relationship between frequency domain information contained in data samples and the frequency response of a suitably designed digital finite impulse response ("FIR") filter suitable for use in the apparatus illustrated in FIG. 1.
Figure 6A:
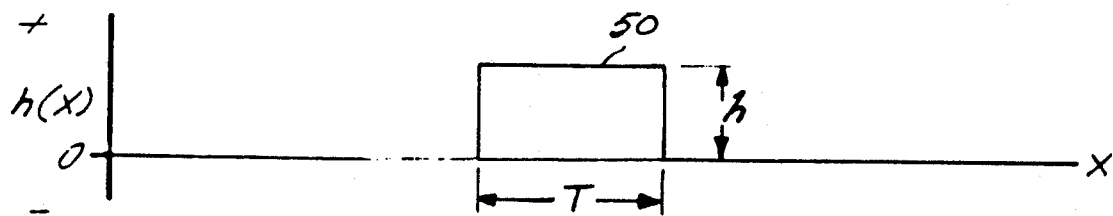
FIG. 6, lines A-E, illustrates the interrelationship between the frequency response of a digital FIR filter and the continuous impulse response of the digital FIR filter; and, FIG. 7, lines A-E, is a series of waveforms illustrating the convolution of the data samples with the continuous impulse response of a four-point digital FIR filter suitable for use in the apparatus illustrated in FIG. 1.
Figure 6B:
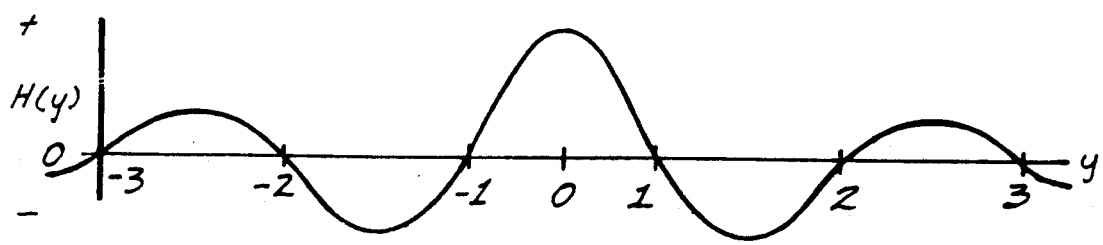
Figure 6C:
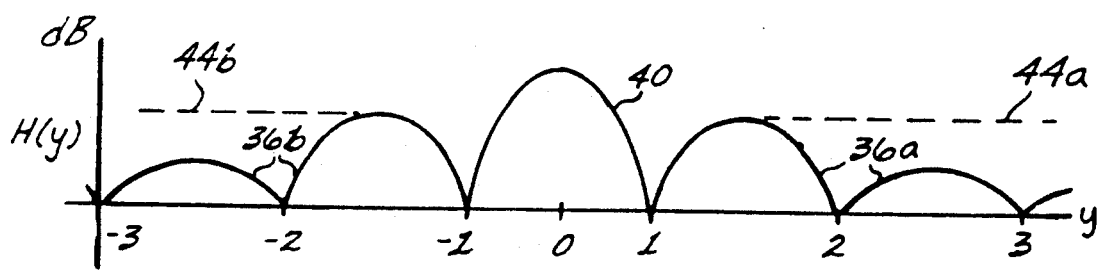
Figure 6D:
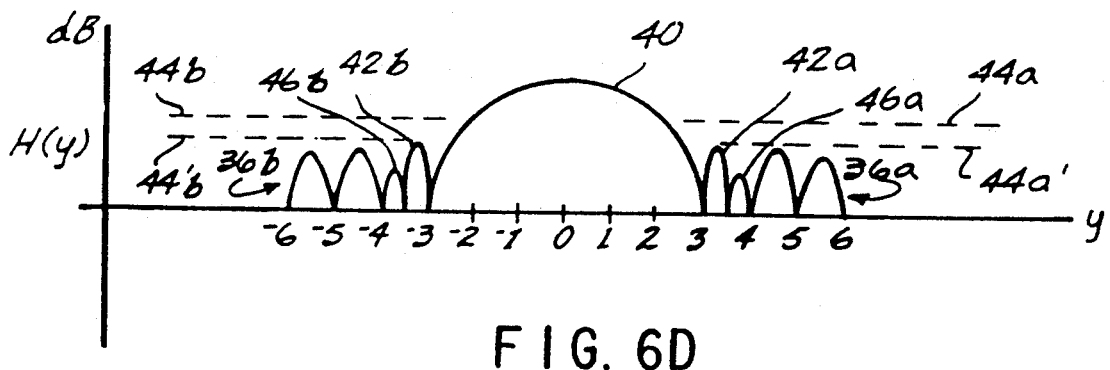
Figure 6E:
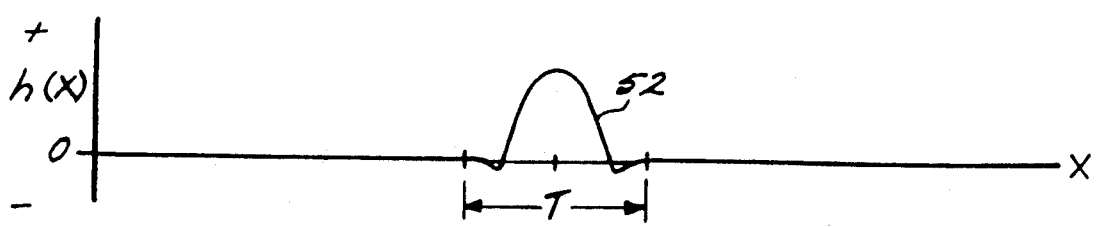
Figure 7A:
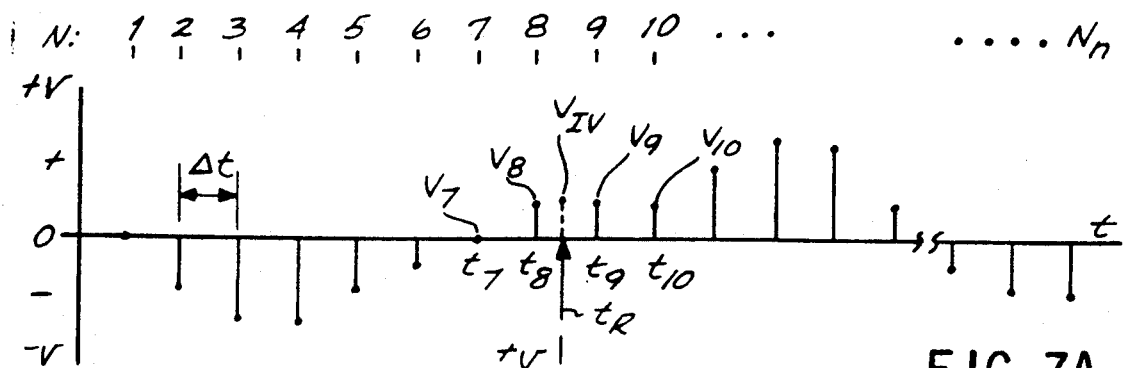
Figure 7B:
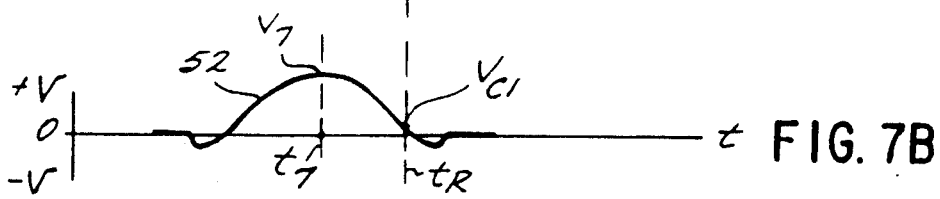
Figure 7C:
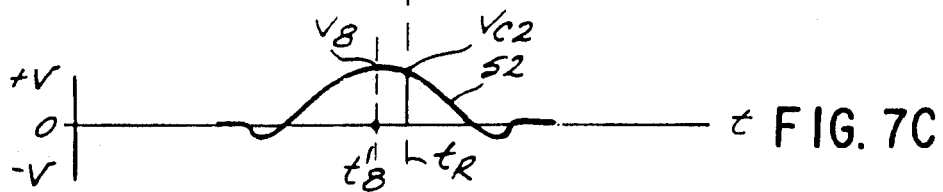
Figure 7D:
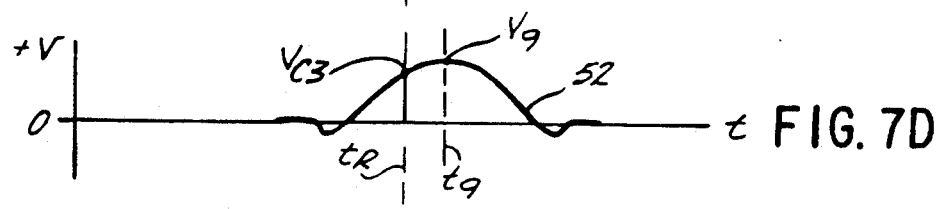
Figure 7E:
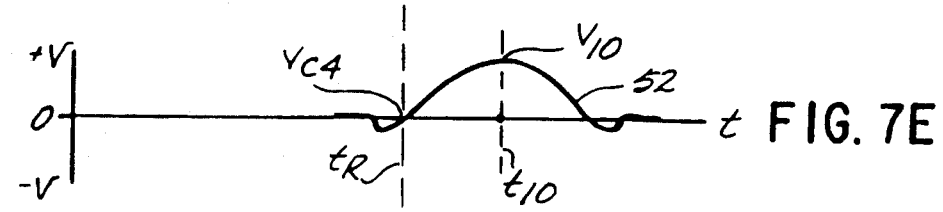

FIG. 5 illustrates the relationship between a digital FIR filter suitable for use with the present invention and the frequency spectrum of an analog signal and its spectral images. An original fluctuating analog signal, such as $V_O$, for example, may be described as having a frequency spectrum 24 with the general shape depicted in FIG. 5. So as to simplify the following discussion, the frequency spectrum 24 is centered about a zero frequency point. As noted above, spectral images are produced during sampling of the $V_O$ signal. As was also noted above, frequency domain information relative to the frequency spectrum 24 and the spectral images is contained in the resulting data samples, $V_S$. As is well known in the sampling art, by sampling the $V_O$ signal at a sampling rate, designated $f_s$, using an oversampling factor, designated m, where m<1, the spectral images are centered at integer multiples of $f_s$ (i.e., $\pm 1 f_s$, $\pm 2 f_s$, $\pm 3 f_s$, etc.). A representative pair of spectral images 25a and 25b are depicted in FIG. 5 as dashed curves and are centered at $\pm 1 f_s$. As is also well known in the sampling art, the bandwidths of the frequency spectrum 24 and the spectral images 25a and 25b are the same and are a function of the sampling rate, $f_s$, and the oversampling factor, m. Specifically, the bandwidths are equal to the sampling rate divided by the oversampling factor (i.e., $f_s/m$). Thus, as illustrated in FIG. 5, the frequency spectrum 24 has a bandwidth that lies between $\pm f_s/2m$. Likewise, the bandwidth of the representative spectral image 25a lies between $$+f_s\left(\frac{2m-1}{2m}\right)$$

and $$+f_s\left(\frac{2m+1}{2m}\right),$$

and the bandwidth of the other representative spectral image 25b lies between $$-f_s\left(\frac{2m-1}{2m}\right)$$

and $$-f_s\left(\frac{2m+1}{2m}\right)$$

As noted above, and as will be better understood from the following discussion, a filter, such as a suitably designed digital FIR filter, can reduce the contributions of the spectral images 25a and 25b to the frequency spectrum 24 when the interpolation of the $V_S$ data samples is performed.

In addition to the original frequency spectrum and images 25a and 25b, FIG. 5 also illustrates an exemplary frequency response 29 for a suitably designed digital FIR filter having the general frequency response function, H(y), discussed above. The frequency response 29 has a shape that is defined by: a main lobe 40; and a series of side lobes 36a and 36b. As is well known in the filtering art, the main lobe 40 comprises a pass band 30 and a pair of transition bands 32a and 32b located on either side of the pass band 30. Transitions between the pass band 30 and the transition bands 32a and 36b are defined by points 62a and 62b, respectively. The series of side lobes 36a and 36b form a pair of stop bands 34a and 34b, located adjacent to transition bands 32a and 32b, respectively. Transitions between the stop band 34a and the transition band 32a, and between the stop band 34b and the transition band 32b are defined by points 60a and 60b, respectively. The pass band 30, transition bands 32a and 32b, and stop bands 34a and 34b are indicated by brackets in FIG. 5. For ease of illustration, the frequency response 29 is centered at the zero frequency point.

As is well known in the filtering art, the shape of the frequency response 29 is determined, in part, by the oversampling factor, m. More specifically, the relationship between the transition points: 60a and 62a; and, 60b and 62b is fixed and is equal to: $2m-1$; where $m>1$. For example, an oversampling factor of two (i.e., m=2) causes points 60a and 60b to occur at three times the frequency of points 62a and 62b. That is, the stop bands 34a and 34b begin at three times the cutoff frequencies of the pass band 30. In the above example (i.e., m=2), the pass band 30 lies between $\pm f_s/4$ and the stop bands begin at $\pm f_s/4$. Since the bandwidth of the original signal frequency spectrum 24 is equal to $f_s/m$, in the above example (i.e., m=2), the bandwidth is equal to $f_s/2$ and lies between $\pm f_s/4$. As a result, the original signal frequency 24 lies within the pass band 30 of the digital FIR filter and the images 25a and 25b lie within the stop bands 34a and 34b.

If the digital FIR filter were a perfect filter, the stop bands 34a and 34b would be perfectly attenuating, and the frequency information passed by the digital FIR filter would simply be the frequency spectrum 24. However, because real filters are not perfect, the stop bands 34a and 34b have imperfect attenuation capabilities. The series of side lobes 36a and 36b depict the imperfect attenuation of the stop bands 34a and 34b. The peak imperfect attenuation level is illustrated in FIG. 5 by the horizontal dashed lines 44a and 44b. Because the stop bands 34a and 34b are not perfectly attenuating, portions of the spectral images 25a and 25b that lie within the stop bands 34a and 34b and are below the attenuation levels 44a and 44b are passed by the digital FIR filter. These portions of the images 25a and 25b passed by the digital FIR filter produce aliasing errors in the frequency information passed by the filter. Thus, the passed frequency information cannot be used to accurately replicate the original signal frequency spectrum 24. As will be better understood from the following discussion, the general shape of the frequency response 29 can be altered through appropriate design of the digital FIR filter. For example, the amplitudes of the series of side lobes 36a and 36b can be reduced, thereby increasing the attenuation levels 44a and 44b of the stop bands 34a and 34b. By increasing the stop band attenuation, a smaller portion of the spectral images 25a and 25b will be passed by the filter and the aliasing errors associated with the original signal frequency spectrum 24 passed by the digital FIR filter will be reduced. As a result, original signal frequency spectrum information contained in the interpolated values, $V_{IV}$, will contain less image information, so that the frequency domain information contained in the $V_{IV}$ values can be used to more accurately replicate the original signal frequency spectrum.

Another source of errors that can distort the original signal frequency spectrum 24 passed by the digital FIR filter is the shape of the pass band 30. In an ideal filter, the pass band 30 would be perfectly flat with respect to frequency. However, in practice, filters are not ideal and the pass band 30 is not perfectly flat. The digital FIR filter illustrated in FIG. 5 has a pass band ripple 38 that may introduce amplitude errors into the frequency spectrum 24 that is passed by the filter. As will be better understood from the following discussion, the pass band flatness can be improved through appropriate filter design by reducing the pass band ripple 38. Reducing the pass band ripple 38 reduces the amplitude errors introduced into the frequency spectrum 24 by the ripple. Thus, in accordance with the invention, it is desirable to design a digital FIR filter that has a suitably flat pass band 30 and suitably attenuating stop bands 34a and 34b. An exemplary method for designing such a digital FIR filter suitable for use in the present invention is discussed next.

In the preferred embodiment of the invention, as was noted above, the digital FIR filter is actually implemented in software form within the signal processor 10. As is well known in the filtering art, the frequency response function, H(y), of such a digital FIR filter depicted by the exemplary frequency response 29 in FIG. 5, can be represented by one or more mathematical equations characterized by poles and zeros in the complex-frequency plane (hereinafter referred to as the frequency plane). As will be better understood from the following discussion, relocating one or more pairs of zeros within the frequency plane is one method of modifying the frequency shape 29. More specifically, the amplitudes of the side lobes 36a and 36b may be adjusted (i.e., reduced) by moving zeros along the real axis in the frequency plane, and the amplitude of the pass band ripple 38 may be adjusted (i.e., reduced) by moving zeros along the imaginary axis of the frequency plane.

As is well known in the filtering art, the frequency response function, H(y), of a filter, such as a digital FIR filter, is related to the continuous impulse response function, h(x), of the filter. Specifically, the h(x) function is the inverse Fourier transform of the H(y) function. Thus, just as with the H(y) function, the h(x) function can be represented by one or more mathematical equations that are the inverse Fourier transform of the equations representing the H(y) function. As a result, changes made to the H(y) function which alter the frequency response 29 will cause corresponding changes in the continuous impulse response function, h(x). As will be presented in the following discussion, each pair of zeros that is moved about the frequency plane adds a cosine term to the equations representing the impulse response function, h(x). Adding cosine terms to the h(x) function changes the shape of the digital FIR filter's impulse response. However, as will be explained more fully below, as long as the number of zeros remains the same within a suitable frequency band, the width of the continuous impulse response, T, remains unchanged.

FIG. 6 illustratively depicts this relationship between the H(y) and h(x) functions of the digital FIR filter. FIG. 6, line A illustrates a rectangular continuous impulse response 50. Such a rectangular impulse response 50 is representative of the h(x) function for a perfect FIR filter. The rectangular impulse response 50 has unity height (i.e., h=1) and width, T. The corresponding H(y) function for a filter having the rectangular impulse response 50 is the Fourier transform of the impulse response 50 and can be defined by an equation of the general form:

$$H(y) = \frac{\sin \pi y}{\pi y}. \tag{1}$$

The frequency response 29 represented by Equation (1) is illustrated in FIG. 6 on line B. The zero crossings of the frequency response 29 are the zeros of Equation (1). By normalizing the frequency scale in FIG. 6 by T, the zeros occur at multiples of 1/T (i.e., $y = \pm 1, \pm 2$, etc.).

The frequency response illustrated in FIG. 6, line B, can be depicted in a more conventional form by changing the ordinate from a linear to a logarithmic magnitude scale. This causes the negative excursions of the frequency response to become positive excursions while remaining in the same relative position along the frequency axis. The resulting shape of the frequency response is illustrated in FIG. 6 on line C and has the same general shape as the frequency response 29 illustrated in FIG. 5 and discussed above. Accordingly, the frequency response shape illustrated in FIG. 6, line C has a main lobe 40 and a series of side lobes 36a and 36b. For reasons of clarity, the pass band 30, transition bands 32a and 32b, and stop bands 34a and 34b are not illustrated in FIG. 6, however, they have the same characteristics as discussed above and illustrated in FIG. 5.

FIG. 6, line D, is a graphical illustration of how relocating zeros along the real axis in the frequency plane can reduce the amplitudes of the side lobes 36a and 36b. For example, by relocating two pairs of zeros that occur at the normalized frequency values of $\pm 1$ and $\pm 2$ (i.e., $y = \pm 1, \pm 2$), the width of the main lobe 40 is increased. Moving one pair of zeros along the real axis causes a new pair of side lobes 46a and 46b to be inserted where the zero pair has been relocated, such as at $y = \pm 3.5$, for example. The reinserted side lobes 46a and 46b reduce the amplitudes of side lobes 42a and 42b, which are adjacent to the main lobe 40. In the above example, the adjacent side lobes 42a and 42b have the highest peak value and therefore determine the attenuation levels 44a and 44b. By moving one pair of zeros from $y = \pm 1$, for example, to $y = \pm 3.5$, the stop band attenuation levels 44a and 44b are increased to levels 44a' and 44b' and are defined by the reduced amplitudes of the adjacent side lobes 42a and 42b.

A second pair of zeros, originally located at $y = \pm 2$ in the above example, can be relocated to a point along the imaginary axis such as $y = \pm i1.3$, for example. The imaginary axis in FIG. 6, line D is normal to the page and is not shown for reasons of clarity. As noted above, by appropriately positioning the second pair of zeros along the imaginary axis, the pass band ripple 38 (not shown) of the frequency response can be reduced. Thus, by appropriately relocating pairs of zeros associated with the frequency response, the pass band ripple 38 and stop band attenuation levels 44a and 44b can be improved.

As noted above, when zeros are relocated in the frequency plane, cosine terms are added to the continuous impulse response function, h(x), which change the shape of the h(x) function. In the example illustrated in FIG. 6, the added cosine terms cause the rectangular impulse response 50 to change to a nonrectangular impulse response 52, whose shape is illustrated in FIG. 6 on line E. The width, T, of the nonrectangular impulse response 52 remains unchanged because, as was noted above, the total number of zeros in the above example was not changed.

So as to better understand the present invention, a brief discussion of the relationship between the movement of zero pairs in the frequency plane and the addition of cosine terms to the time domain function is presented next. As noted above, Equation (1) represents the frequency response of a perfect filter having the rectangular impulse response 50 illustrated in FIG. 6, line A. As is well known in the filtering art, a perfect filter, i.e., a rectangular impulse response 50 is not achievable. A more realistic filter has a nonrectangular impulse response (such as the nonrectangular impulse response 52 illustrated in FIG. 6, line E, for example). Such a nonrectangular impulse response 52 can be represented by introducing a series of cosine terms into Equation (1). The corresponding frequency function, H(y), for such a nonrectangular impulse response 52 can be defined by an equation of the general form:

$$H(y) = \sum_{l=-n}^{n} a_l \cdot \frac{\sin \pi (y - l)}{\pi (y - l)}. \quad (2)$$

where:

n is the number of cosine terms in the time domain;
l is an integer; and,
$a_l$ is a coefficient of the $l^{th}$ cosine term.

Equation (2) represents a series of waveforms, each having the general frequency shape defined by Equation (1), centered at different frequencies (i.e., y−l) and having different amplitudes (i.e., $a_l$). This is further illustrated by writing Equation (2) in a slightly different form as illustrated by the following equation:

$$H(y) = \sin \pi y \sum_{l=-n}^{n} \frac{(-1)^l a_l}{\pi (y - l)}. \quad (3)$$

The corresponding time domain or continuous impulse response function, h(x), is defined as the inverse Fourier transform of Equation (2), and can be represented by an equation having the general form:

$$h(x) = R(x) \sum_{l=0}^{n} (-1)^l A_l \cos 2\pi l x \quad (4)$$

where:

R(x) is a rectangle having unit width and height.
$A_l$ is a coefficient of a cosine term defined as:

$A_l = 2(-1)^l a_l$ for $l \neq 0$; and, $A_l = a_l$ for $l = 0$; and, $$x = \frac{t}{T}$$

where T is the width of the h(x) function. Thus, as illustrated by Equation (4), a nonrectangular impulse response 52 can be defined by a constant and a series of cosine terms.

As stated above, such a nonrectangular impulse response 52 has the corresponding frequency shape defined by Equation (3). For reasons to be discussed below, Equation (3) can be reduced to a rational fraction having the general form:

$$H(y) = \frac{y}{\pi} \sin \pi y \frac{B_0[(y^2 - \alpha_1^2)(y^2 - \alpha_2^2) \ldots (y^2 - \alpha_n^2)]}{y^2 \times (y^2 - 1) \ldots (y^2 - n^2)} \quad (5)$$

where:

$B_0$ is a constant; and, $\alpha_l$ (where l is an integer between 1 and n) is related to $A_l$ in Equation (4). The $\alpha_l$ terms are the roots (i.e., zeros) of the numerator in Equation (5).

As can be seen by comparing Equations (4) and (5), the number of cosine terms in the time domain (Equation (4)) is related to the number of new zeros in the frequency domain (Equation (5)). Moving a zero in the frequency plane is accomplished by adding an appropriate $\alpha_l$ term to Equation (5) that cancels one zero term and replaces the cancelled zero term with a new zero term, thus relocating the cancelled zero to a new location without changing the number of zero terms. Adding $\alpha_l$ terms to Equation (5) so as to relocate a zero causes a cosine term to be added to Equation (4) because, as noted above, the $\alpha_l$ terms are related to the $A_l$ terms (i.e., the cosine coefficients).

Thus, by moving zeros of the H(y) function in the frequency plane so as to improve the stop band attenuation 44a and 44b and improve the flatness of the pass band 30, causes cosine terms to be added to the impulse response in the time domain. As will be readily understood from the foregoing discussion by a person of reasonable skill in this art, the frequency response of a digital FIR filter can be designed so as to optimize the stop band attenuation 44a' and 44b' and pass band ripple 38 of the filter by moving zeros in the frequency plane.

As will be better understood from the following discussion, and in accordance with the preferred embodiment of the present invention, the continuous impulse response function, h(x), can be convolved with the data sample values, $V_S$, to (eventually) produce the interpolated values, $V_{IV}$, at the appropriate resample times, $t_R$. In general, during a convolution operation, the h(x) function is centered at an appropriate sample time, $t_S$, so that a $t_R$ time is encompassed by the finite impulse response width, T. The h(x) function is multiplied by the $V_S$ value corresponding to the centered $t_S$ time, thereby producing a weighted h(x) function. A convolved value, designated $V_C$, is the particular value of the weighted h(x) function corresponding to the $t_R$ time encompassed by the impulse response width, T. As will be better understood from the following discussion, a plurality of $V_C$ values for each $t_R$ time are computed when a plurality of weighted h(x) functions overlap the $t_R$ time. The plurality of $V_C$ values are summed at each $t_R$ time to produce the interpolated value, $V_{IV}$. The convolution steps briefly discussed above are illustrated in FIG. 7 and discussed in greater detail next by way of an example. In the example which follows, a four-point digital FIR filter is used. As noted above, a four-point filter has a h(x) function whose width, T, encompasses four data samples, (i.e., $4\Delta t \leq T < 5\Delta t$).

FIG. 7, line A, illustrates an exemplary series of $V_S$ values produced by a time-based sampling process. The $V_S$ values occur at $t_S$ times that, preferably, are spaced apart by equal time intervals, designated $\Delta t$. In the above example, each $t_S$ time is assigned an integer value, designated N, starting, for example, with the first $t_S$ time (i.e., N=1) and increasing sequentially to the last $t_S$ time (i.e., N=Nth value). This is illustrated in FIG. 7, line A as the integers 1 to N above the series of $t_S$ times. A $t_R$ time, preferably, is located between two adjacent $t_S$ points—$t_8$ and $t_9$ or designated integers 8 and 9, for example. In this example, the four $t_S$ times located nearest to $t_R$, designated integer values of seven through ten (i.e., N=7-10), are located at sample times, designated $t_7$ through $t_{10}$, and have $V_S$ values, designated $V_7$ through $V_{10}$, respectively.

The convolution operation is illustrated in FIG. 7 on lines B-E. The h(x) function is represented by the non-rectangular impulse response shape 52. Impulse response 52 is weighted by centering impulse response 52 on sample times $t_7$ through $t_{10}$ to produce convolution values. First, the impulse response 52 is centered at $t_7$ and is multiplied by the $V_7$ value to produce a convolution value, designated $V_{C1}$, located at $t_R$. Next, the impulse response 52 is centered at $t_8$ and multiplied by $V_8$ to produce a convolution value, designated $V_{C2}$, located at $t_R$. Similarly, the impulse response 52 is separately located at $t_9$ and $t_{10}$ and multiplied by $V_9$ and $V_{10}$ to produce convolution values, designated $V_{C3}$ and $V_{C4}$, respectively. Next, the $V_{C1}$-$V_{C4}$ values are summed to produce the $V_{IV}$ value at the $t_R$ time. The convolution process is repeated for subsequent $t_R$ times until a $V_{IV}$ value has been computed for each $t_R$ time.

The convolution operation illustrated in the above example can be expressed in terms of a general convolution equation having the following form:

$$V_{IV} = \sum_{k=1}^{q} V_S(N_k \Delta t) h\left(\frac{t_R - N_k \Delta t}{T}\right) \quad (6)$$

where: k is an integer; and, q is equal to the number of $t_S$ times encompassed by the impulse response width, T, (i.e., q=4 for the four-point digital FIR filter in the above example). The impulse response function, h(x), is expressed in terms of the $t_R$ time offset by an integer multiple of $\Delta t$ (i.e., $N_k \Delta t$) and therefore forms an offset impulse response function $$\left(\text{i.e., } h\left(\frac{t_R - N_k \Delta t}{T}\right)\right).$$

Since, as was discussed above, each $t_S$ time is assigned a sequential integer value (i.e., 1 to N), the $t_S$ times located near any $t_R$ time can be defined by the following equation:

$$N_k = N_0 + k \quad (7)$$

where $N_0$ is the integer multiple of $\Delta t$ for the $t_S$ time closest to $t_R$, and k is the integer defined in Equation (6). $N_0$ can be calculated from the following equation:

$$N_0 = INT\left(\frac{t_R}{\Delta t} + 0.5\right) \quad (8)$$

where $N_0$ is rounded off to the nearest integer.

An offset between $t_R$ and $N_0$, designated t', is computed from the following equation:

$$t' = t_R - N_0 \Delta t \quad (9)$$

Solving Equation (7) for $N_0$ and substituting this value into Equation (8) and rearranging the terms provides the following relationship:

$$t_R - N_k \Delta t = t' - k \Delta t \quad (10)$$

Substituting the right-hand side of Equation (10) into the impulse response term in Equation (6) yields the following relationship:

$$h\left(\frac{t_R - N_k \Delta t}{T}\right) = h\left(\frac{t' - k \Delta t}{T}\right). \quad (11)$$

Equation (11) illustrates how the offset impulse response function (i.e., $$h\left(\frac{t_R - N_k \Delta t}{T}\right)\text{)}$$

of the digital FIR filter can be expressed in terms of the offset time, $$\left(\text{i.e., } h\left(\frac{t' - k \Delta t}{T}\right)\right).$$

Substituting the right side of Equation (11) into Equation (6) produces the following equation:

$$V_{IV} = \sum_{k=1}^{q} V_S(N_k \Delta t) h\left(\frac{t' - k \Delta t}{T}\right) \quad (12)$$

As illustrated in Equation (12), $V_{IV}$ can be computed from a general convolution equation by multiplying the $V_S$ values (i.e., $V_S(N_k \Delta t)$) by the offset impulse response function $$\left(\text{i.e., } h\left(\frac{t' - k \Delta t}{T}\right)\right).$$

The products are then summed to produce the $V_{IV}$ value at the resampling time, $t_R$.

Generally, the value of t' is different for each $t_R$ time and, as a result, the value of $$h\left(\frac{t' - k \Delta t}{T}\right)$$

must be computed for each $t_R$ time. There are several well-known techniques for computing $$h\left(\frac{t' - k \Delta t}{T}\right),$$

a few of which are noted next. One technique is to store several precalculated values of the impulse response function (i.e., h(x)) and use these values to compute $$h\left(\frac{t' - k \Delta t}{T}\right)$$

directly. Another technique is to store only a few precalculated values of h(x) and interpolate to find $$h\left(\frac{t'-k\Delta t}{T}\right).$$

Additionally, if a large look-up table of cosine terms is available, Equation (4) could be solved directly and the result could be inserted directly into Equation (6). Obviously, several conventional techniques exist for computing the value of $$h\left(\frac{t'-k\Delta t}{T}\right),$$

and, as such, these techniques do not form a part of the present invention.

As can be seen from examining Equation (12), the present invention provides a representation of a continuous approximation of the $V_O$ signal. That is, for any $t_R$ time desired, Equation (12) can be solved to provide the corresponding $V_{IV}$ value. As noted above, in addition to time domain information, the $V_{IV}$ values computed from Equation (12) contain frequency domain information that can be used to accurately replicate the $V_O$ signal frequency spectrum.

Figure 4A:
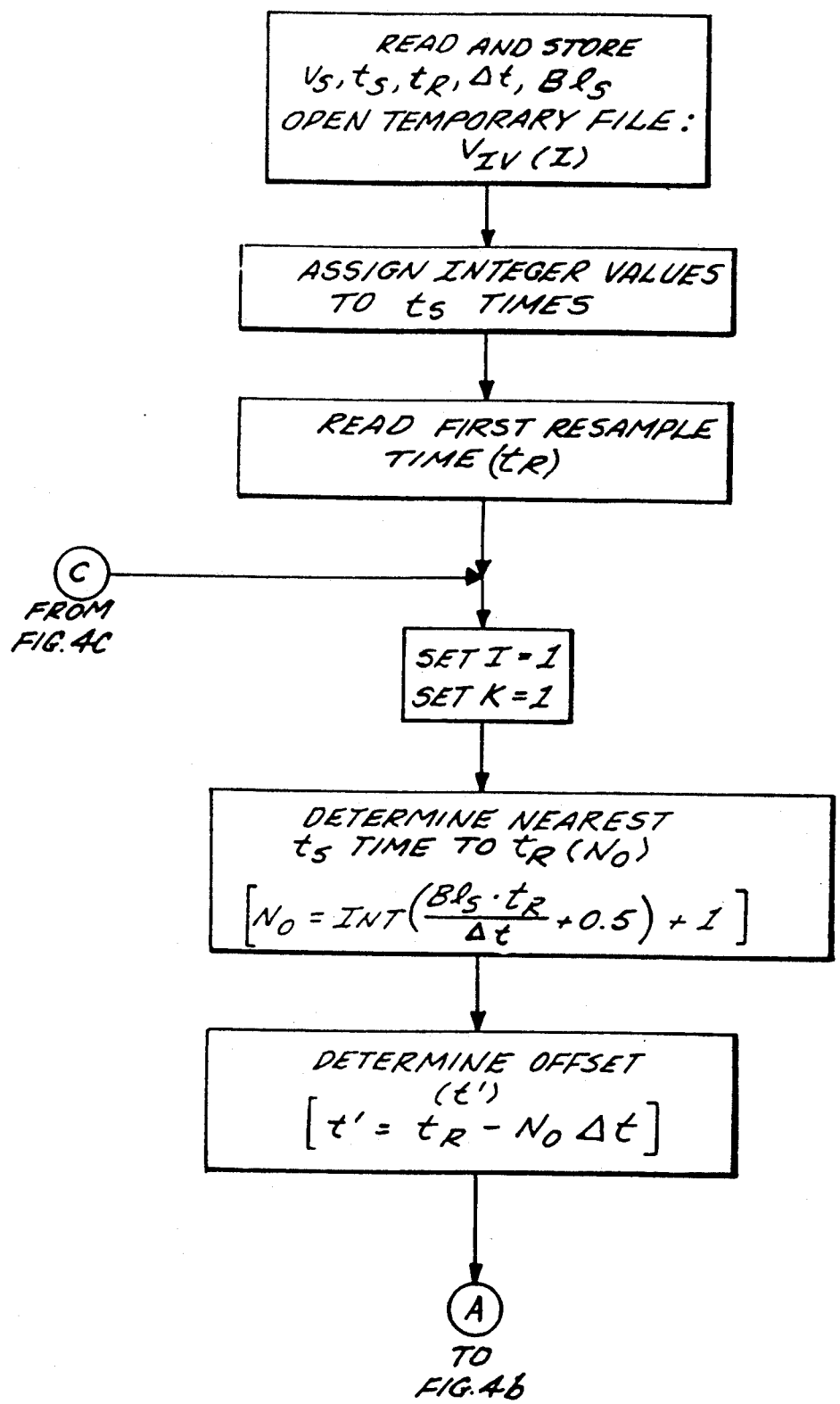
FIGS. 4a, 4b and 4c are more detailed flowcharts of the functional steps illustrated in FIG. 2.
Figure 4B:
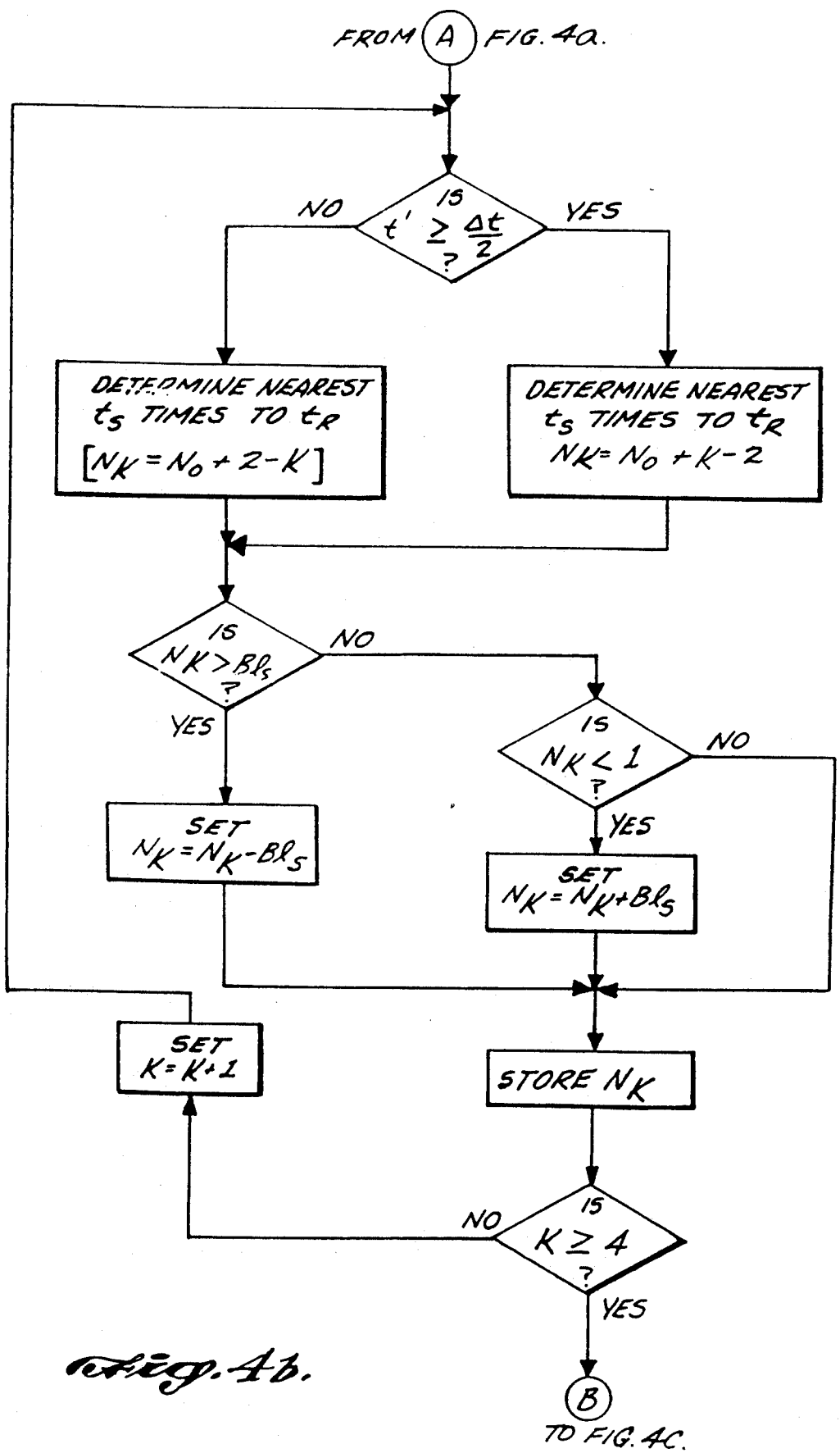
Figure 4C:
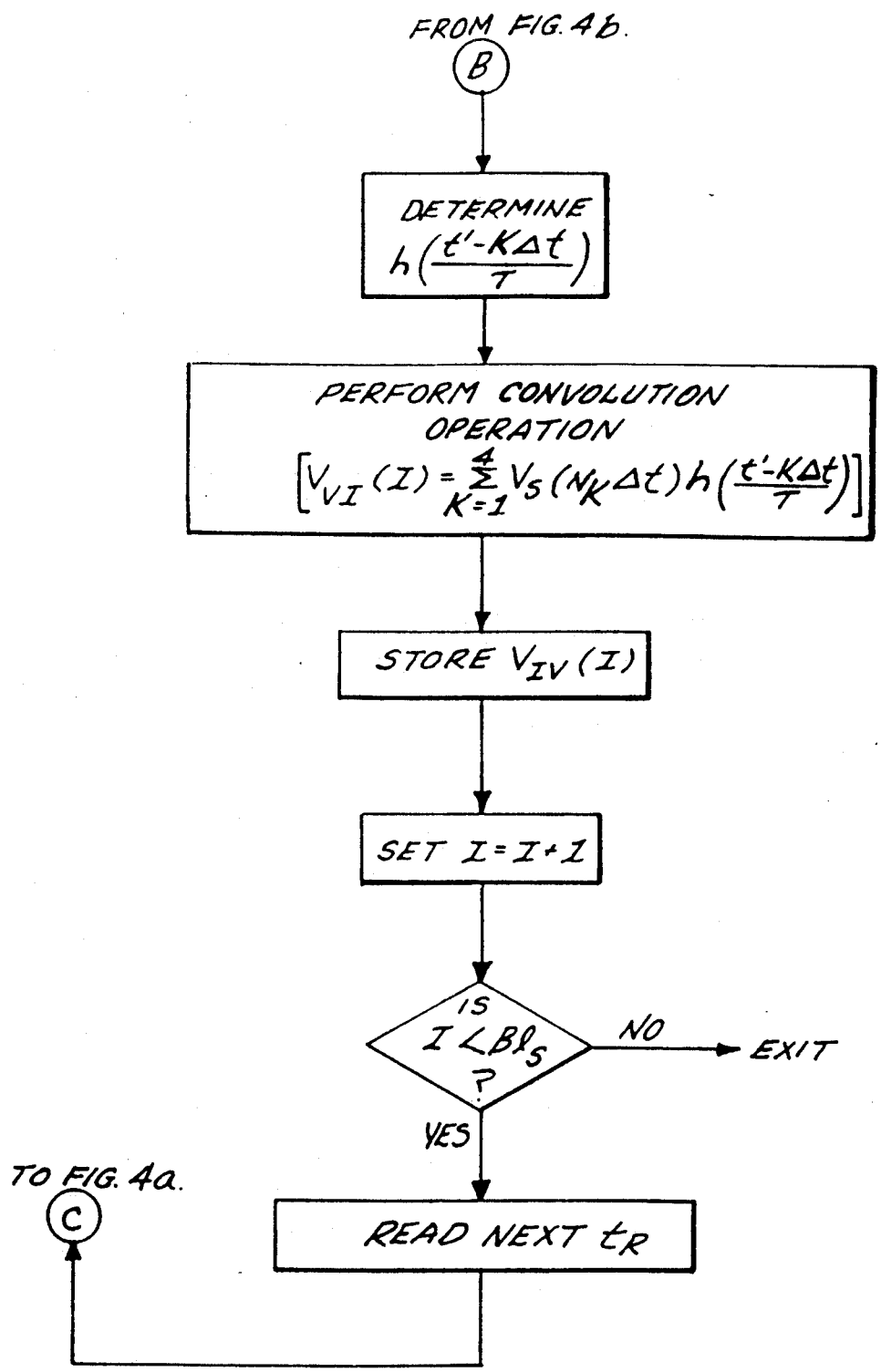

As set forth in the foregoing discussion and in accordance with the preferred embodiment of the present invention, a digital FIR filter is used in a novel manner to interpolate between data samples of an analog signal and produce interpolated values that contain accurate $V_O$ signal frequency spectrum information. As noted above, such a digital FIR filter is preferably implemented in software form in a program that controls a signal processor 10 suitable for carrying out the invention. The broad functional steps of such a program are illustrated in FIG. 2 and discussed above. A more detailed flow chart of the program depicted in FIG. 2 is illustrated in FIGS. 4a, 4b, and 4c and discussed next. The steps set forth in FIGS. 4a–4c are examples of a four-point digital FIR filter application, such as for the four-point filter discussed in the above example. Obviously, the steps depicted in FIGS. 4a–4c can be readily adapted to other digital FIR filters (such as a ten-point filter, for example).

Initially, as illustrated in FIG. 4a, the program instructs the signal processor 10 to read and store: the $V_S$ values; the $t_S$ times; the $t_R$ times; the $\Delta t$ interval; and, the data block size, Bls. The program further instructs the signal processor 10 to open a temporary file, $V_{IV}(I)$, for storing the computed $V_{IV}$ values.

Next, the program causes the signal processor 10 to assign sequential integer values, N, to the $t_S$ times that have been read and stored. Preferably, the signal processor 10 begins with the first $t_S$ time and proceeds sequentially to the last $t_S$ time. That is, for example, if there are ten $t_S$ times, they are consecutively numbered 1–10 from the first to the last $t_S$ time. Next, the signal processor 10 is instructed to read the first $t_R$ time.

The next functional step performed by the signal processor 10 is to determine the set of $t_S$ times that are closest to the first $t_R$ time. As noted above, the size of the set is determined by the width of the impulse response, T. First, a resampling index counter, designated I, and a summation index counter, designated K, are initialized (i.e., I=1 and K=1). Next, the program instructs the signal processor 10 to determine the closest $t_S$ time to the first $t_R$ time, i.e., $N_0$. $N_0$ is computed from the following equation:

$$N_0 = INT\left[\left(\frac{Bls \cdot t_R}{\Delta t}\right)+0.5+1\right]. \tag{13}$$

Next, the offset, t', between the first resample time, $t_R$, and the nearest $t_S$ time, (i.e., $N_0 \cdot \Delta t$) is computed from Equation (9) above. Once $N_0$ and t' have been computed, the program instructs the signal processor 10 to find the other $t_S$ times, in the set of $t_S$ times closest to $t_R$. In the present example, i.e., a four-point digital FIR filter application, the signal processor 10 will locate the four $t_S$ times closest to $t_R$. Specifically, and as illustrated in FIG. 4b, if t' is equal to or greater than half the interval between adjacent $t_S$ times (i.e., $t' \geq \Delta t/2$), then the four closest $t_S$ times are determined by the following equation:

$$N_K = N_0 + K - C. \tag{14}$$

If t' is less than half the $\Delta t$ interval (i.e., $t' < \Delta t/2$), then the four closest $t_S$ values are determined by the following equation:

$$N_K = N_0 + C - K. \tag{15}$$

In Equations (14) and (15), K is the summation index counter value noted above and C is an integer whose value is one-half the number of $t_S$ times encompassed by T (i.e., where C=2 for the four-point filter in the above example).

After the first $N_K$ point has been determined from Equation (14) or (15), the program determines whether the $N_K$ point lies within the data block (i.e., $1 \leq N_K \leq Bls$) and, if not, adjusts the $N_K$ value so that it is within the data block. More specifically, if the integer value of the $t_S$ time lies outside the data block (i.e., $N_K > Bls$), and is greater than or equal to one (i.e., $N_K \geq 1$), the program places the $t_S$ time within the data block by subtracting the data block size from the integer value of the $t_S$ time (i.e., $N_K = N_K - Bls$). The signal processor 10 stores this value of $N_K$. If the integer value of the $t_S$ time is outside the data block and is less than one (i.e., $N_K < 1$), then the program adds the data block size to the integer value of the $t_S$ time (i.e., $N_K = N_K + Bls$) and stores this value of $N_K$. If the integer value of the $t_S$ time is within the data block (i.e., $1 \leq N_K \leq Bl_s$), the value of $N_K$ is stored.

Next, the program determines if all of the $t_S$ times in the set have been found. Specifically, in the four-point filter example discussed above, if the summation index counter value is less than four (i.e., K<4) then the counter is incremented (i.e., K=K+1) and the above process is repeated. A summation index counter value greater than or equal to four (i.e., K≥4) indicates that the four $t_S$ times in the set have been found and the program proceeds to the next functional step, which is described next and illustrated in FIG. 4c.

Once the appropriate number of $t_S$ times near the $t_R$ time have been found, the signal processor 10 convolves the continuous impulse response function (h(x)), of a suitably designed digital FIR filter with the $V_S$ values of the $t_S$ times found in the set discussed above. As noted above, a suitable digital FIR filter is preferably implemented in software form and can be characterized by one or more mathematical formulae, such as Equation (2) (i.e., the frequency response function, H(y)) and Equation (4) (i.e., the impulse response function, h(x)), for example. The program instructs the signal processor 10 to determine a particular value of the offset impulse response function, $$h\left(\frac{t'-K\Delta t}{T}\right),$$

defined in Equation (11) above, where k is replaced by K in the program illustrated in FIG. 4C. As discussed above, the value of $$h\left(\frac{t'-K\Delta t}{T}\right)$$

can be determined by conventional techniques. Next, the signal processor 10 performs the convolution operation by using the value of $$h\left(\frac{t'-K\Delta t}{T}\right)$$

in the general convolution equation set forth in Equation (12) where, as noted above, k=K and q=4. The resulting $V_{IV}$ value is stored as a $V_{IV}(I)$ value. This last step in the program performs the two functional steps illustrated in FIG. 2 and discussed above. That is, the functional steps of producing the $V_C$ values and summing them to produce a $V_{IV}$ value are performed by the signal processor 10 in the convolution operation step illustrated in FIG. 4C.

Once the $V_{IV}$ value has been computed and stored by the signal processor 10, the program increments the resampling counter, I (i.e., I=I+1). If the resampling counter value is less than or equal to the total number of resample times read by the signal processor 10 (i.e., I≦Bls), then the next $t_R$ time is read and the above steps are repeated. A resampling counter value that exceeds the total number of resample times (i.e., I>Bls) indicates that the $V_{IV}$ values have been computed for all $t_R$ times read by the signal processor 10 and the program is exited.

As can be readily appreciated from the foregoing description, the invention provides a method and apparatus for preserving the frequency spectrum of a sampled analog signal using a digital FIR filter in a novel manner for interpolating between data samples. As a result, the interpolated values contain frequency information that can be used to accurately replicate the frequency spectrum of the analog signal. While a preferred embodiment of the invention has been illustrated and described herein, it is to be understood that, within the scope of the appended claims, various changes can be made. For example, digital FIR filters other than the four-point filter discussed in the above example can also be used. In fact, even non-FIR filters (i.e., filters having continuous impulse responses of infinite width) can be utilized, however, the convolution operation becomes much more complex. The frequency response and impulse response of the digital FIR filter can also be different than as illustrated and discussed above. Likewise, an oversampling factor other than two (i.e., 1<m≠2) could also be used. While the time interval, Δt, between adjacent data samples is preferably the same, the invention is capable of performing its intended function even when the data samples are produced by a sampling process that samples the analog signal at a variable rate. Furthermore, the program merely illustrates one possible method of carrying out the invention and it is to be understood that other equally suitable programs could be utilized. Hence, the invention can be practiced otherwise than as specifically described herein.

The embodiments of the invention in which an exclusive property or privilege is claimed are defined as follows:

1. A method of producing interpolated values that contain accurate information about the frequency spectrum of an analog signal which has been band-limited and then sampled, the method comprising the steps of:
   (a) storing data samples of the analog signal; and,
   (b) interpolating between said data samples to produce interpolated values, the interpolating comprising the substeps of:
     (b1) receiving an unconstrained selection of resample times at which said stored data samples are to be interpolated;
     (b2) weighting a set of said stored data samples with a continuous nonrectangular impulse response of a filter having a predetermined frequency response comprising a substantially flat passband and suitably attenuating stopbands, said weighting producing a plurality of convolution values at each of said unconstrained selection of resample times; and,
     (b3) summing said plurality of convolution values at each of said unconstrained selection of resample times and producing an interpolated value at each of said unconstrained selection of resample times.

2. The method of producing interpolated values as claimed in claim 1, wherein said substep of weighting a set of said data samples comprises the steps of:
   (a) locating the set of data samples for each of said resample points; and,
   (b) weighting with said nonrectangular impulse response of said filter each of said data samples in each of said sets and producing a convolution value for each of said data samples in each of said sets.

3. The method of producing interpolated values as claimed in claim 1, wherein said substep of weighting a set of said data samples comprises the steps of:
   (a) locating the set of data samples for each of said resample times; and
   (b) weighting with said nonrectangular impulse response of said filter each of said data samples in each of said sets and producing a convolution value for each of said data samples in each of said sets.

4. The method of claim 1 in which the weighting substep comprises:
   weighting a set of said data samples with a continuous nonrectangular impulse response of a filter designed to have a predetermined frequency response comprising a substantially flat passband and suitably attenuating stopbands by relocating zeroes of a function associated with said frequency response in the complex frequency plane.

5. The method of producing interpolated values as claimed in claim 1, wherein the analog signal is sampled at a sampling frequency, fs, with an oversampling factor, m, and the predetermined frequency response includes a substantially flat passband for a band of frequencies between $-fs/2m$ and $fs/2m$, and suitably attenuating stopbands for frequencies above $$fs\left(\frac{2m-1}{2m}\right)$$

and below $$-fs\left(\frac{2m-1}{2m}\right).$$

6. The method of producing interpolated values as claimed in claim 5, wherein the weighting step reduces the contribution of passband errors to said frequency domain information passed by the filter and contained in the interpolated values and attenuates information about images of the frequency spectrum of the analog signal contained in said interpolated values.

7. A method of producing interpolated values as in claim 5 wherein a frequency function for the continuous nonrectangular impulse response has a general form as follows:

$$H(y) = \sum_{L=-n}^{n} a_L \cdot \frac{\sin\pi(y-L)}{\pi(y-L)}.$$

8. An apparatus for producing interpolated values that contain accurate information about the frequency spectrum of an analog signal which has been band-limited and then sampled, the apparatus comprising:
   (a) a receiver for receiving data samples of the analog signal; and,
   (b) interpolating means coupled to said receiver for receiving said data samples and an unconstrained selection of resample times at which said data samples are to be interpolated, said interpolating means interpolating between said data samples to produce interpolated values at said resample times, wherein said interpolating means includes
      (b1) a filter producing a continuous nonrectangular impulse response and an associated frequency response;
      (b2) a data locator coupled to said receiver for receiving said data samples and said resample times and locating a set of said data samples located near each of said resample times;
      (b3) convolving means, coupled to said data filter and said data locator, for each of said resample times, weighting the set of the data samples with the continuous nonrectangular impulse response of the filter to produce a plurality of convolution values; and
      (b4) a summer coupled to the convolving means which sums the plurality of convolution values at each of the resample times to produce one of the interpolated values at each of the resample times.

9. An apparatus for producing interpolated values as in claim 8 wherein a frequency function for the continuous nonrectangular impulse response has a general form as follows:

$$H(y) = \sum_{L=-n}^{n} a_L \cdot \frac{\sin\pi(y-L)}{\pi(y-L)}.$$

10. The apparatus of claim 8 in which the associated frequency response of the filter is designed to have a substantially flat passband and suitably attenuating stopbands by relocating zeroes of a function associated with the frequency response in the complex frequency plane.

11. The apparatus for producing interpolating values as claimed in claim 8, wherein said frequency response of said filter comprises:
   (a) a pass band for passing frequency domain information about the frequency spectrum of the analog signal and reducing contribution from pass band errors contained in said interpolated values; and,
   (b) stop bands for reducing contribution from images of the frequency spectrum of the analog signal contained in said interpolated values.

12. An apparatus for producing interpolated values as in claim 11 wherein a frequency function for the continuous nonrectangular impulse response has a general form as follows:

$$H(y) = \sum_{L=-n}^{n} a_L \cdot \frac{\sin\pi(y-L)}{\pi(y-L)}.$$

13. The apparatus for interpolating values as claimed in claim 8, wherein said filter is a digital filter.

14. The apparatus for interpolating values as claimed in claim 13, wherein said digital filter is a digital finite impulse response filter.

15. The apparatus for interpolating values as claimed in claim 14, wherein said digital finite impulse response filter is implemented in software form.

* * * * *